(12) United States Patent
Suzuki (10) Patent No.: US 10,770,882 B2
(45) Date of Patent: Sep. 8, 2020

(54) POWER MODULE

(71) Applicant: SHINDENGEN ELECTRIC MANUFACTURING CO., LTD., Tokyo (JP)

(72) Inventor: Kenichi Suzuki, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 139 days.

(21) Appl. No.: 15/543,173

(22) PCT Filed: Apr. 6, 2016

(86) PCT No.: PCT/JP2016/061223
§ 371 (c)(1),
(2) Date: Jul. 12, 2017

(87) PCT Pub. No.: WO2017/175326
PCT Pub. Date: Oct. 12, 2017

(65) Prior Publication Data
US 2018/0048141 A1 Feb. 15, 2018

(51) Int. Cl.
*H02H 3/08* (2006.01)
*H03K 17/082* (2006.01)
(Continued)

(52) U.S. Cl.
CPC .............. *H02H 3/08* (2013.01); *H02H 3/05* (2013.01); *H02H 3/085* (2013.01); *H02H 7/222* (2013.01);
(Continued)

(58) Field of Classification Search
CPC ........... H03K 17/0822; H03K 17/0828; H03K 17/00–98; H03K 17/08–0828; H02H 3/085; H02H 3/08
See application file for complete search history.

(56) References Cited

U.S. PATENT DOCUMENTS 5,091,664 A 2/1992 Furuhata
5,563,759 A * 10/1996 Nadd ................. H03K 17/0828
361/101

(Continued)

FOREIGN PATENT DOCUMENTS

JP S62-064120 A 3/1987
JP H02-266712 A 10/1990
(Continued)

OTHER PUBLICATIONS

JP 2014-215723. Oct. 22, 2014. (Year: 2014).*
(Continued)

*Primary Examiner* — Jared Fureman
*Assistant Examiner* — Christopher J Clark (57) ABSTRACT

When a short-circuit failure has occurred in a power semiconductor device provided in a power module, a radical and rapid temperature increase is prevented by instantly interrupting a short-circuit current. A power module 10 has a package 10*a*. Provided in the package 10*a* are: a MOSFET 21 serving as the power semiconductor device; a resistor 23 serving as a detecting means for detecting an operation state of the MOSFET 21 and outputting a detection signal; and a MOSFET 22 serving as a current-interrupting purpose switch connected in series to the MOSFET 21. In response to a control signal Si2 generated on the basis of the detection signal, the MOSFET 22 goes into a conduction state during a normal operation of the MOSFET 21 and goes into an interruption state so as to interrupt a current flowing in the MOSFET 21 when a short-circuit failure has occurred in the MOSFET 21.

2 Claims, 8 Drawing Sheets (51) Int. Cl.
*H03K 17/081* (2006.01)
*H03K 17/08* (2006.01)
*H02M 1/32* (2007.01)
*H02M 1/08* (2006.01)
*H02H 7/22* (2006.01)
*H02H 3/05* (2006.01)
*H03K 17/687* (2006.01)
*H02M 1/00* (2006.01)
*H02M 3/335* (2006.01)

(52) U.S. Cl.
CPC ............... *H02M 1/08* (2013.01); *H02M 1/32* (2013.01); *H03K 17/0822* (2013.01); *H03K 17/08104* (2013.01); *H03K 17/687* (2013.01); *H02M 3/33592* (2013.01); *H02M 2001/0009* (2013.01); *H02M 2001/327* (2013.01); *H03K 2017/0806* (2013.01); *H03K 2217/0027* (2013.01); *Y02B 70/1475* (2013.01)

(56) References Cited

U.S. PATENT DOCUMENTS

| | | | |
|---|---|---|---|
| 2012/0099236 A1* | 4/2012 | Cyuzawa | H02J 1/06 361/101 |
| 2012/0256574 A1 | 10/2012 | Tanaka et al. | |
| 2014/0070786 A1* | 3/2014 | Guerra | G05F 1/618 323/285 |
| 2017/0294908 A1* | 10/2017 | Kawamoto | H01L 29/78 |
| 2018/0083435 A1* | 3/2018 | Redler | H02H 3/087 |

FOREIGN PATENT DOCUMENTS

| | | |
|---|---|---|
| JP | H03-040517 A | 2/1991 |
| JP | H07-115354 A | 5/1995 |
| JP | H08-054427 A | 2/1996 |
| JP | 2008-017557 A | 1/2008 |
| JP | 2008-236907 A | 10/2008 |
| JP | 2009-019953 A | 1/2009 |
| WO | 2011/086705 A1 | 7/2011 |
| WO | 2016/047455 A1 | 3/2016 |

OTHER PUBLICATIONS

IL 237775. Mar. 16, 2015. (Year: 2015).*
International Search Report for PCT/JP2016/061223, dated Jun. 21, 2016.
WIPO, Written Opinion for PCT/2016/061223, dated Jun. 21, 2016.

* cited by examiner

POWER MODULE

TECHNICAL FIELD

The present invention relates to a power module that is used in a power source circuit or the like and has a power semiconductor device installed therein.

BACKGROUND ART

Conventionally, in a power source circuit configured as an inverter or the like, a power semiconductor device such as a power MOSFET, a bipolar transistor, an Insulated Gate Bipolar Transistor (IGBT), or the like is used as a switching device. Usually, such power semiconductor devices are packaged in a power module in which one or more of such devices are housed in a package provided with a heat radiating plate or the like. Patent Literature 1 and Patent Literature 2 each describe a conventional example of a power module.

Figure 8:
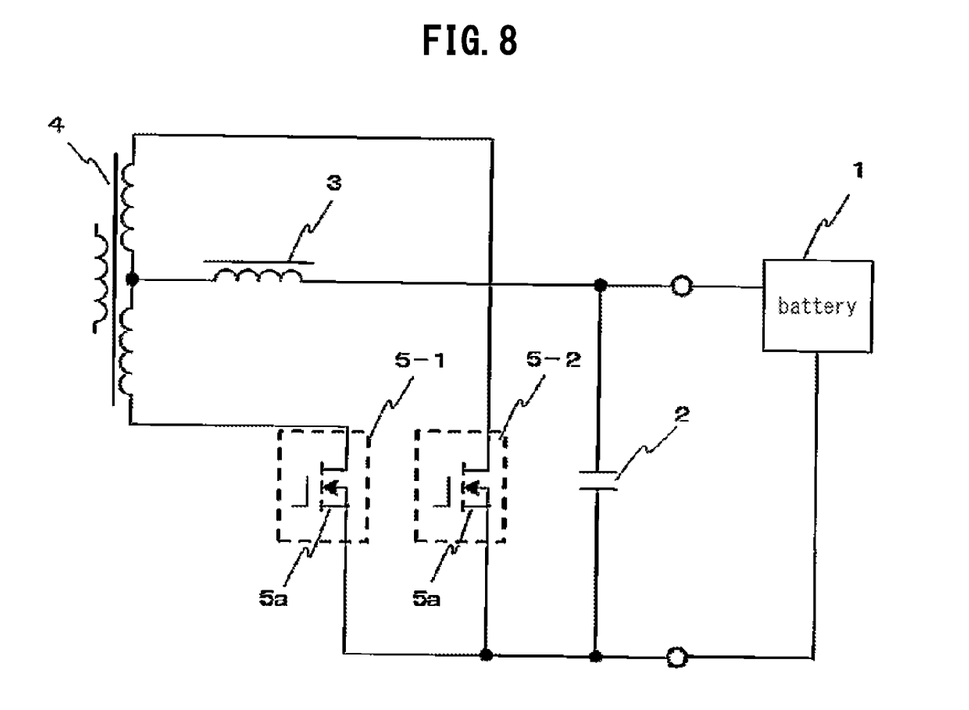
FIG. 8 is a circuit diagram illustrating an example of a power source circuit having a conventional power module.

FIG. 8 is a circuit diagram illustrating an example of a power source circuit having a conventional power module.

The power source circuit is a circuit in which an alternating-current voltage supplied from the primary side positioned to the left of the transformer 4 is converted into a direct-current voltage by two power modules 5-1 and 5-2 on the secondary side positioned on the right, by alternately performing ON/OFF switching processes, so as to charge a battery 1 via a choke coil 3 and a capacitor 2. Within the package of each of the power modules 5-1 and 5-2, a MOSFET 5a serving as a switching-purpose power semiconductor device is installed.

Conventionally, when a power module (e.g., the power module 5-1 or 5-2) is used in a power source circuit, a measure is taken in consideration of deteriorations of the power semiconductor device (e.g., the MOSFET 5a) that may be caused by generation of heat due to operations with high electric power. For example, Patent Literature 1 describes a method for detecting deteriorations of solder joint parts by detecting degradation in thermal resistance on the basis of changes in a current value that are observed when a forward current is caused to flow through the power semiconductor device. Patent Literature 2 describes a method for keeping the temperature at joint parts of a semiconductor device equal to or lower than a tolerance value even when a large current flows therethrough, by using a wide band gap semiconductor as a power semiconductor device. Further, in power source circuits such as that illustrated in FIG. 8, another measure is also taken where, for example, a fuse for the purpose of preventing an overcurrent is inserted in the supply path to the battery 1.

CITATION LIST

Patent Literature

Patent Literature 1: Japanese Patent Laid-Open No. 2009-19953
Patent Literature 2: International Publication No. WO2011/086705

SUMMARY OF INVENTION

Technical Problem

However, the conventional power module (e.g., the power module 5-1 or 5-2) has the following problems (a) to (c):

(a) Although measures are taken as described above to detect deteriorations of the power semiconductor device (e.g., the MOSFET 5a) and to reduce the temperature rise thereof, the power modules 5-1 and 5-2 themselves are not provided with any protection function. For this reason, when a short-circuit failure has occurred in either of the MOSFETs 5a provided in the power modules 5-1 and 5-2, it is not possible to restrict the short-circuit current caused thereby.

(b) When an overcurrent is prevented by inserting a fuse in an external circuit, the current value at which the circuit is cut off is determined by using the current in the entire circuit (e.g., the power source circuit) as an evaluation criterion. For this reason, when a circuit uses a plurality of power modules such as the power modules 5-1 and 5-2, it is difficult to address a short-circuit current for each of the power modules 5-1 and 5-2 individually.

(c) When a fuse is used, it takes a certain period of time to cut off the circuit. When a short-circuit failure has occurred in either of the power modules 5-1 and 5-2, the temperature increases radically and rapidly. For this reason, it is necessary to interrupt the current as instantly as possible for safety reasons. It is therefore difficult to select the fuse to be used.

It is an object of the present invention to solve the problems described above and to provide a power module that, when a short-circuit failure has occurred in a power semiconductor device provided in a power module, is able to prevent a radical and rapid temperature increase by instantly interrupting the short-circuit current.

Solution to Problem

A power module of the present invention is structured so that a package houses therein: a power semiconductor device used for a switching purpose to conduct/interrupt a current; a detecting means for detecting an operation state of the power semiconductor device and outputting a detection signal; and a switch for a current-interrupting purpose that is connected in series to the power semiconductor device and is configured to, in response to a control signal generated on a basis of the detection signal, go into a conduction state so as to conduct a current flowing in the power semiconductor device during a normal operation of the power semiconductor device and to go into an interruption state so as to interrupt the current flowing in the power semiconductor device when a short-circuit failure has occurred in the power semiconductor device.

Advantageous Effects of Invention

The power module according to the present invention achieves advantageous effects as described in (i) and (ii) below.

(i) Because the current-interrupting purpose switch is provided in the package of the power module while being connected in series to the power semiconductor device, it is possible to instantly interrupt a short-circuit current occurring in the power semiconductor device.

(ii) Because the detecting means for detecting the operation state of the power semiconductor device is provided in the package of the power module, it is possible to easily detect the occurrence of a short-circuit failure in the power semiconductor device, without the need to provide a detecting means externally.

With these arrangements, when a short-circuit failure has occurred in the power semiconductor device in the power module, it is possible to prevent a radical and rapid temperature increase by instantly interrupting the short-circuit current.

DESCRIPTION OF EMBODIMENTS

Embodiments to carry out the present invention will be clear when the following description of preferred embodiments is read with reference to the accompanying drawings. It should be noted, however, that the drawings are for explanation purposes only and are not intended for limiting the scope of the present invention.

First Embodiment

A Configuration of a Power Module According to a First Embodiment

Figure 1:
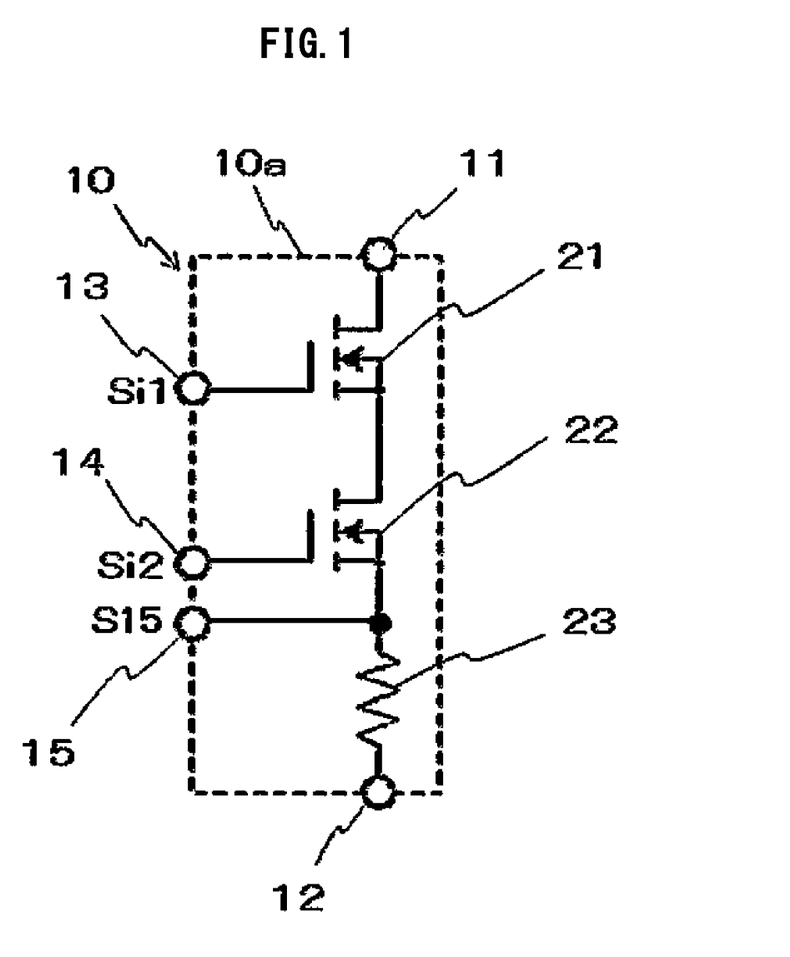
FIG. 1 is a schematic circuit diagram illustrating a power module according to a first embodiment of the present invention.

FIG. 1 is a schematic circuit diagram illustrating a power module according to a first embodiment of the present invention.

A power module 10 has a package 10a that houses therein a power semiconductor device and the like. The package 10a is formed by using resin, ceramics, or the like that is highly resistant to heat and is highly electrically insulative. The package 10a is provided with a current input terminal 11, a current output terminal 12, a control terminal 13 that receives an input of a switching signal Si1, a control terminal 14 that receives an input of a control signal Si2, and a detection terminal 15 that outputs a current detection signal S15.

The package 10a houses therein a switching-purpose power semiconductor device (e.g., a MOSFET) 21, a current-interrupting purpose switch (e.g., a MOSFET) 22, and a current detecting means (e.g., a resistor) 23 serving as an example of a detecting means. A drain source of the MOSFET 21, a drain source of the MOSFET 22, and the resistor 23 are connected in series between the current input terminal 11 and the current output terminal 12. A gate of the MOSFET 21 is connected to the control terminal 13. Further, a gate of the MOSFET 22 is also connected to the control terminal 14. A connection point between the MOSFET 22 and the resistor 23 is connected to the detection terminal 15.

The MOSFET 21 has a function of conducting/interrupting the current flowing between the current input terminal 11 and the current output terminal 12, as a result of the connection between the drain and the source thereof being turned on/off by the switching signal Si1 input from the control terminal 13 to the gate. The MOSFET 22 has a function of going into a conduction state (an ON state) so as to conduct the current flowing in the MOSFET 21 during normal operations of the MOSFET 21 and a function of going into an interruption state (an OFF state) so as to interrupt the current flowing in the MOSFET 21 when a short-circuit failure has occurred in the MOSFET 21, as a result of the connection between the drain and the source thereof being turned on/off by the control signal Si2 flowing from the control terminal 14 to the gate.

From the detection terminal 15 and the current output terminal 12, it is possible to extract the voltage between the two ends of the resistor 23 as the detection signal (e.g., a current detection signal) S15 used for detecting an operation state of the MOSFET 21. The extracted current detection signal S15 is supplied to a control circuit (not illustrated) provided on the outside. The control signal Si2 is generated by the control circuit and is input to the control terminal 14. Accordingly, the resistor 23 has a function as a detecting means (e.g., a current detecting means) for detecting an operation state of the MOSFET 21 and outputting the current detection signal S15.

An Operation of a Power Module According to the First Embodiment

When having determined that the current detection signal S15 output from between the detection terminal 15 and the current output terminal 12 is within a normal range, the control circuit provided on the outside generates the current-conducting purpose control signal Si2 and inputs the generated control signal Si2 to the control terminal 14. The current-conducting purpose control signal Si2 that has been input brings the MOSFET 22 into the ON state. While in this state, the MOSFET 21 is turned on or off by the switching signal Si1 input thereto from the control terminal 13, so that the current flowing between the current input terminal 11 and the current output terminal 12 is either conducted or interrupted.

When the MOSFET 21 becomes deteriorated and a short-circuit failure has occurred in the MOSFET 21, a large short-circuit current flows into the resistor 23 via the MOSFET 22. As a result, the current detection signal S15 output from between the detection terminal 15 and the current output terminal 12 is supplied to the control circuit (not illustrated) provided on the outside.

Because the current detection signal S15 increased, the control circuit provided on the outside determines that a short-circuit failure has occurred in the MOSFET 21 and generates a current-interrupting purpose control signal Si2, so as to input the generated control signal Si2 to the control terminal 14. When the current-interrupting purpose control signal Si2 is input to the control terminal 14, the MOSFET 22 instantly switches from the ON state into the OFF state, so that the current flowing in the MOSFET 21 is interrupted. As a result, the MOSFET 21 is prevented from having a radical and rapid temperature increase.

Application Example 1 of the First Embodiment

Figure 2:
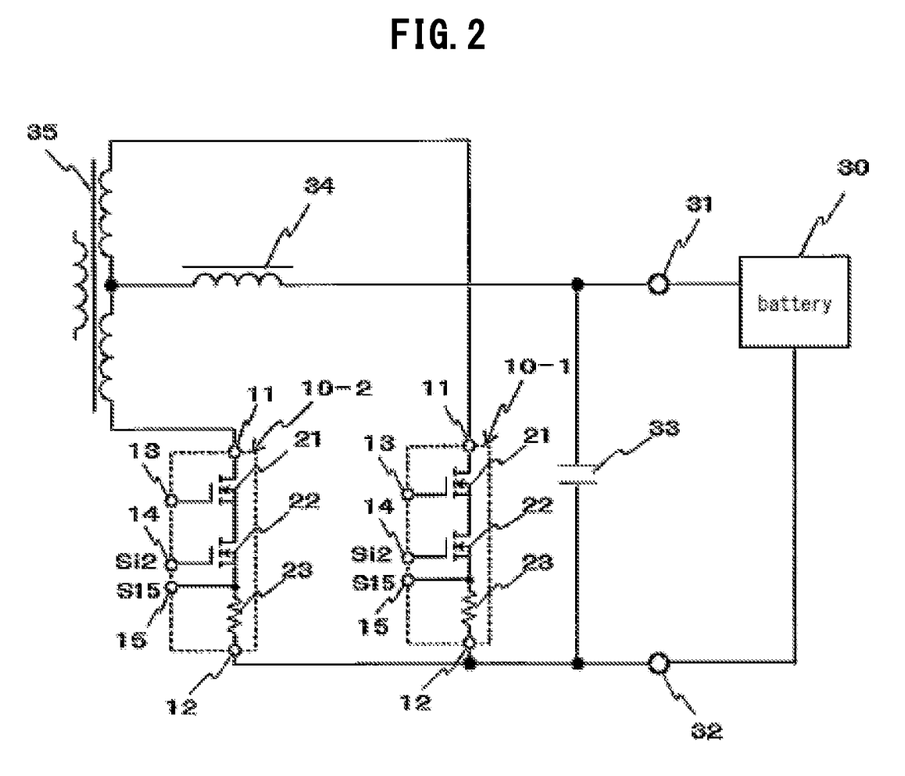
FIG. 2 is a schematic circuit diagram of a power source circuit illustrating application example 1 of FIG. 1.

FIG. 2 is a schematic circuit diagram of a power source circuit illustrating application example 1 of the power module 10 illustrated in FIG. 1.

The power source circuit has a positive electrode input terminal 31 and a negative electrode input terminal 32 that receive an input of a direct-current voltage supplied to a battery 30. To the positive electrode input terminal 31 and the negative electrode input terminal 32, a transformer 35 is connected via a capacitor 33 and a choke coil 34. Between one of the electrodes of the transformer 35 and the negative electrode input terminal 32, a first power module 10-1 is connected. Further, between the other electrode of the transformer 35 and the negative electrode input terminal 32, a second power module 10-2 is also connected.

The first and the second power modules 10-1 and 10-2 each have the same configuration as that of the power module 10 illustrated in FIG. 1. As for the first power module 10-1, the current input terminal 11 is connected to one of the electrodes of the transformer 35, while the current output terminal 12 is connected to the negative electrode input terminal 32. Further, as for the second power module 10-2, the current input terminal 11 is connected to the other electrode of the transformer 35, while the current output terminal 12 is connected to the negative electrode input terminal 32.

The power source circuit configured as described above operates in the following manner:

An alternating-current voltage supplied by the primary side positioned to the left of the transformer 35 is converted into a direct-current voltage as a result of the two power modules 10-1 and 10-2 switching on and off alternately on the secondary side positioned to the right of the transformer 35. The direct-current voltage is smoothed as being routed through the choke coil 34 and the capacitor 33 and is supplied to the battery 30. As a result, the battery 30 is charged.

In each of the first and the second power modules 10-1 and 10-2, the MOSFET 22 is in the ON state during normal operations of the MOSFET 21, so as to conduct the current flowing in the MOSFET 21. At this time, the voltage between the two ends of the resistor 23 is extracted from between the detection terminal 15 and the current output terminal 12 by the control circuit (not illustrated) provided on the outside, as the current detection signal S15 for the current flowing in the two MOSFETs 21 and 22.

When having determined that the current detection signal S15 is in a normal range, the control circuit provided on the outside inputs the current-conducting purpose control signal Si2 to the control terminal 14 in the MOSFET 22 so as to bring the MOSFET 22 into the ON state. In contrast, when the current detection signal S15 has increased, and the control circuit provided on the outside determines that a short-circuit failure has occurred in the MOSFET 21, the control circuit inputs the current-interrupting purpose control signal Si2 through the control terminal 14 so as to bring the MOSFET 22 into the OFF state. As a result, when the short-circuit failure has occurred in the MOSFET 21, the current path is instantly blocked, so as to stop an excessive supply of the direct current from the battery 30 and to prevent the MOSFET 21 from having a radical and rapid temperature increase.

Application Example 2 of the First Embodiment

Figure 3:
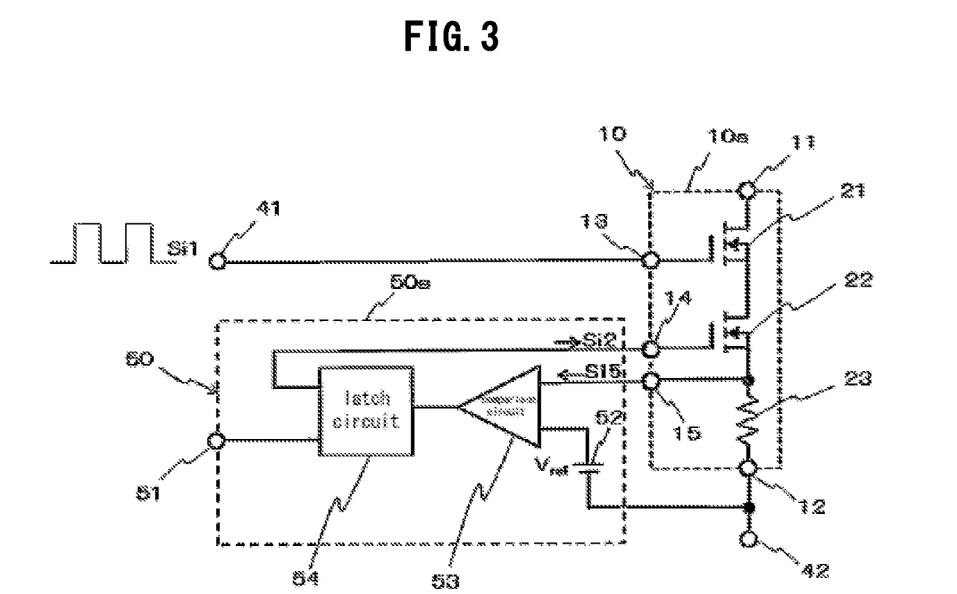
FIG. 3 is a schematic circuit diagram of a control-circuit-attached power module illustrating application example 2 of FIG. 1.

FIG. 3 is a schematic circuit diagram of a control-circuit-attached power module illustrating application example 2 of the power module 10 illustrated in FIG. 1.

The control-circuit-attached power module has an input terminal 41 that receives an input of a switching signal Si1 having a rectangular wave and an output terminal 42. To the input terminal 41 and the output terminal 42, the power module 10 illustrated in FIG. 1 and a control circuit 50 are connected. In other words, the input terminal 41 is connected to the control terminal 13 of the power module 10, whereas the output terminal 42 is connected to the control circuit 50 and to the current output terminal 12 of the power module 10. To the control terminal 14 and the detection terminal 15 of the power module 10 and to the output terminal 42, the control circuit 50 is externally connected.

The control circuit 50 is a circuit configured to control operations of the power module 10 from the outside thereof. For example, the control circuit 50 is structured as a module by being housed in a package 50a. The package 50a is provided with an input terminal 51. A lead wire drawn out of the package 50a is connected to the control terminal 14 and the detection terminal 15 of the power module 10 and to the output terminal 42.

The control circuit 50 has a reference voltage source 52 that outputs a reference voltage Vref, a comparison circuit 53, and a latch circuit 54. Of the reference voltage source 52, the negative electrode side is connected to the output terminal 42, while the positive electrode thereof is connected to a second input terminal of the comparison circuit 53. A first input terminal of the comparison circuit 53 is connected to the detection terminal 15 of the power module 10. The comparison circuit 53 is a circuit configured to output a comparison signal by comparing the levels of the current detection signal S15 input thereto from the first input terminal and the reference voltage Vref input thereto from the second input terminal. To the output side of the comparison circuit 53, an input terminal of the latch circuit 54 is connected.

The input terminal 51 is connected to another input terminal of the latch circuit 54. Further, an output terminal of the latch circuit 54 is connected to the control terminal 14 of the power module 10. The latch circuit 54 is a circuit configured to latch the comparison signal output from the comparison circuit 53 on the basis of a drive signal input thereto from the input terminal 51, and to output the control signal Si2 to the control terminal 14 of the power module 10 with predetermined timing.

The control-circuit-attached power module configured as described above operates in the following manner:

In the control circuit 50, the voltage value of the resistor 23 that is output as the current detection signal S15 from the detection terminal 15 of the power module 10 is input to the comparison circuit 53 so as to be compared with the reference voltage Vref. The reference voltage Vref is set to have such a voltage value with which it is possible to judge a voltage occurring in the resistor 23 due to the current from a normal operation of the MOSFET 21 and a voltage occurring due to a current at the time of a short-circuit failure. Accordingly, when the current detection signal S15 is smaller than the reference voltage Vref, the comparison circuit 53 outputs a comparison signal yielding a normal operation to the latch circuit 54. On the contrary, when the current detection signal S15 is larger than the reference voltage Vref, the comparison circuit 53 outputs a comparison signal yielding an interrupting operation to the latch circuit 54.

While the comparison signal yielding the normal operation is being output from the comparison circuit 53, the latch circuit 54 outputs the control signal Si2 to bring the MOSFET 22 into the ON state, to the control terminal 14. In contrast, once the comparison signal yielding the interrupting operation is output from the comparison circuit 53, the latch circuit 54 outputs the control signal Si2 to bring the MOSFET 22 into the OFF state to the control terminal 14 and maintains this state.

The externally-connected control circuit 50 configured as described above is also appended to each of the power modules 10-1 and 10-2 illustrated in FIG. 2. When the externally-connected control circuit 50 is used for each of the plurality of power modules 10-1 and 10-2 being used, it is also acceptable to use a circuit that integrally includes the control circuits corresponding to each of the plurality of power modules 10-1 and 10-2 being used.

In the first embodiment, as for the current value used for determining the occurrence of a short-circuit failure, for example, a current value that is two to three times as large as a rated current of the MOSFET 21 may be used as an evaluation criterion. A detection voltage corresponding to the current value may be used as the reference voltage Vref.

Advantageous Effects of the First Embodiment

The power modules 10 (i.e., the power modules 10-1 and 10-2) according to the first embodiment and a power source circuit including the same achieve advantageous effects (a) to (c) below:

(a) When a short-circuit failure occurs in the MOSFET 21 provided therein, the power modules 10-1 and 10-2 illustrated in FIG. 2 are each configured to interrupt an excessive supply of the current from the battery 30 by instantly blocking the current path thereof. Consequently, it is possible to prevent the MOSFET 21 from having a radical and rapid temperature increase.

(b) It is possible to display the occurrence of a short-circuit failure in either of the power modules 10-1 and 10-2 as described above in (a) by displaying an alarm or the like in either the control circuit 50 or the entire power source circuit. In particular, by displaying the alarm in the control circuit 50, it is possible to indicate the location of the failure.

(c) It is sufficient when the MOSFET 22 functions only as a switch for interrupting the current. Accordingly, the MOSFET 22 does not need to operate at a high speed. For example, the operation speed of the MOSFET 22 may be so much slower as to be expressed with a numerical value having one less digit than the numerical value indicating the operation speed of the MOSFET 21. It is therefore possible to make the size of the chip compact.

Second Embodiment

A Configuration According to a Second Embodiment

Figure 4:
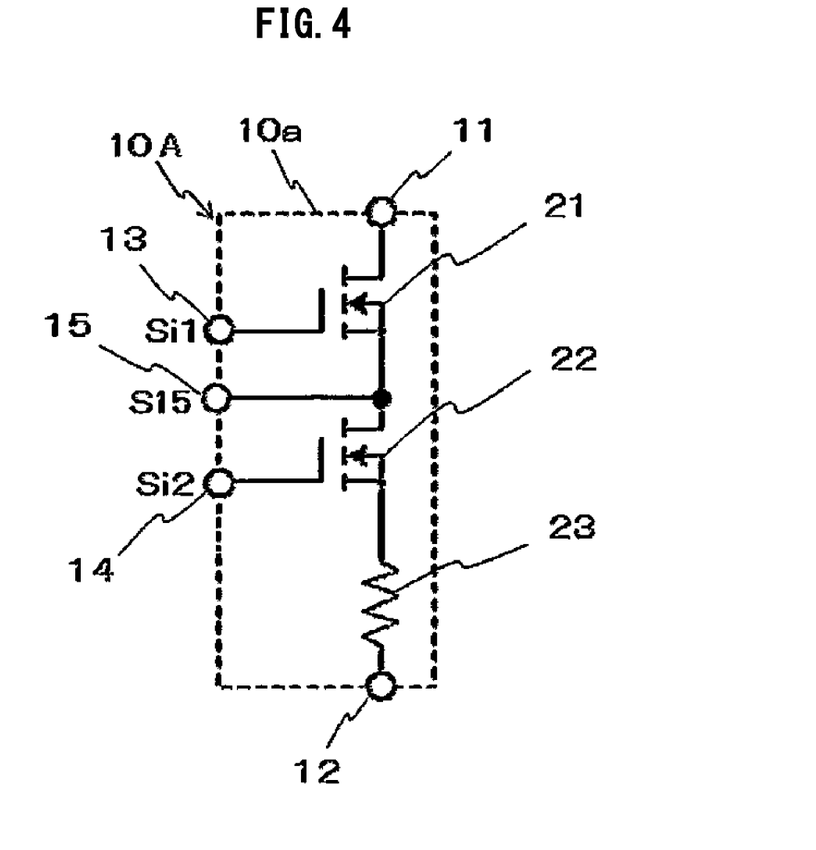
FIG. 4 is a schematic circuit diagram illustrating a power module according to a second embodiment of the present invention.

FIG. 4 is a schematic circuit diagram illustrating a power module according to a second embodiment of the present invention. Some of the elements that are the same as those in FIG. 1 illustrating the first embodiment will be referred to by using the same reference characters.

A power module 10A according to the second embodiment is different from the power module 10 according to the first embodiment in that the detection terminal 15 is connected to the connection point between the MOSFET 21 and the MOSFET 22. From the detection terminal 15 and the current output terminal 12, the voltage between the two ends of a circuit including the MOSFET 22 and the resistor 23 is extracted as the current detection signal S15 used for detecting an operation state of the MOSFET 21.

The other configurations of the second embodiment are the same as those in the first embodiment.

An Operation in the Second Embodiment

Operations performed by the power module 10A according to the present embodiment are the same as the operations performed by the power module 10 according to the first embodiment, except that the current detection signal S15 according to the second embodiment is larger than the current detection signal S15 in the power module 10 according to the first embodiment by an amount corresponding to the voltage occurring between the two ends of the MOSFET 22. The current detection signal S15 is supplied to a control circuit (not illustrated) provided on the outside. The control circuit generates the control signal Si2 and inputs the generated control signal Si2 to the control terminal 14.

When having determined that the current detection signal S15 output thereto from between the detection terminal 15 and the current output terminal 12 is within a normal range, the control circuit provided on the outside generates the current-conducting purpose control signal Si2 and inputs the generated control signal Si2 to the control terminal 14. The current-conducting purpose control signal Si2 that has been input brings the MOSFET 22 into the ON state.

When a short-circuit failure has occurred in the MOSFET 21, a large short-circuit current flows in the MOSFET 22 and the resistor 23, and the current detection signal S15 therefore increases. As a result, the control circuit provided on the outside generates the current-interrupting purpose control signal Si2 and inputs the generated control signal Si2 to the control terminal 14, so as to instantly interrupt the current flowing in the MOSFET 21 by switching the MOSFET 22 from the ON state into the OFF state. Consequently, it is possible to prevent the MOSFET 21 from having a radical and rapid temperature increase.

Third Embodiment

A Configuration According to a Third Embodiment

Figure 5:
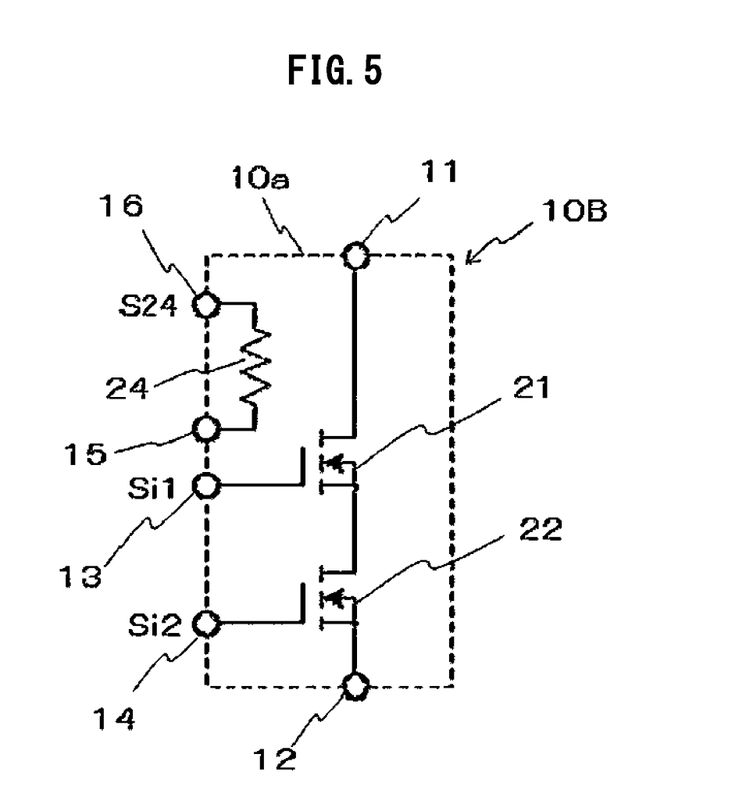
FIG. 5 is a schematic circuit diagram illustrating a power module according to a third embodiment of the present invention.

FIG. 5 is a schematic circuit diagram illustrating a power module according to a third embodiment of the present invention. Some of the elements that are the same as those in FIG. 1 illustrating the first embodiment will be referred to by using the same reference characters.

In a power module 10B according to the third embodiment, a temperature sensing device 24 such as a thermistor serving as a temperature detecting means is provided in place of the resistor 23 included in the power module 10 according to the first embodiment. Further, another detection terminal 16 is newly provided in addition to the detection terminal 15 provided in the power module 10 according to the first embodiment.

The two detection terminals 15 and 16 are provided for the package 10a. The temperature sensing device 24 is connected to a point between the two detection terminals 15 and 16. The temperature sensing device 24 is a device that is installed in the vicinity of the MOSFET 21 and is configured to detect a temperature exhibited during operations of the MOSFET 21 and to output a temperature detection signal S24 to the detection terminals 15 and 16. For example, when a thermistor is used as the temperature sensing device 24, because the resistance value of the thermistor changes in accordance with the temperature, the change in the resistance value may be used as the temperature detection signal S24.

The other configurations of the third embodiment are the same as those in the first embodiment.

An Operation in the Third Embodiment

When a short-circuit failure has occurred in the MOSFET 21 provided in the power module 10B, the temperature of the MOSFET 21 increases. The temperature increase is detected by the temperature sensing device 24, and the temperature detection signal S24 is therefore output from the detection terminals 15 and 16. The temperature detection signal S24 is supplied, for example, to a control circuit similar to the externally-connected control circuit 50 illustrated in FIG. 3.

For example, in the control circuit similar to the externally-connected control circuit 50 illustrated in FIG. 3, the comparison circuit 53 compares the supplied temperature detection signal S24 with the reference voltage Vref. The temperature of the MOSFET 21 during operations thereof is dependent on the type of the MOSFET 21, the structure thereof including a heat radiating plate or the like, the operation conditions thereof, and the like. Further, the detected temperature varies depending on the location in which the temperature sensing device 24 is installed. Accordingly, the reference voltage Vref is set so as to be dependent on the power module 10B subject to the processing. In other words, the reference voltage Vref is set to have such a voltage value with which it is possible to judge the temperature detected during a normal operation of the MOSFET 21 and the temperature detected at the time of a short-circuit failure.

When the temperature detection signal S24 is smaller than the reference voltage Vref, the comparison circuit 53 outputs a comparison signal yielding a normal operation. On the contrary, when the temperature detection signal S24 is larger than the reference voltage Vref, the comparison circuit 53 outputs a comparison signal yielding an interrupting operation. While the comparison signal yielding the normal operation is being output from the comparison circuit 53, the latch circuit 54 outputs the control signal Si2 that brings the MOSFET 22 into the ON state. In contrast, once the comparison signal yielding the interrupting operation is output from the comparison circuit 53, the latch circuit 54 outputs the control signal Si2 that brings the MOSFET 22 into the OFF state and maintains this state.

Advantageous Effects of the Third Embodiment

The power module 10B according to the third embodiment is provided with the temperature sensing device 24 configured to detect the occurrence of a short-circuit failure in the MOSFET 21 at the time of the occurrence. It is therefore possible to instantly block the current path of the MOSFET 21 when a short-circuit failure has occurred. Accordingly, it is possible to prevent the MOSFET 21 from having a radical and rapid temperature increase by blocking any excessive current.

Fourth Embodiment

A Configuration According to a Fourth Embodiment

Figure 6:
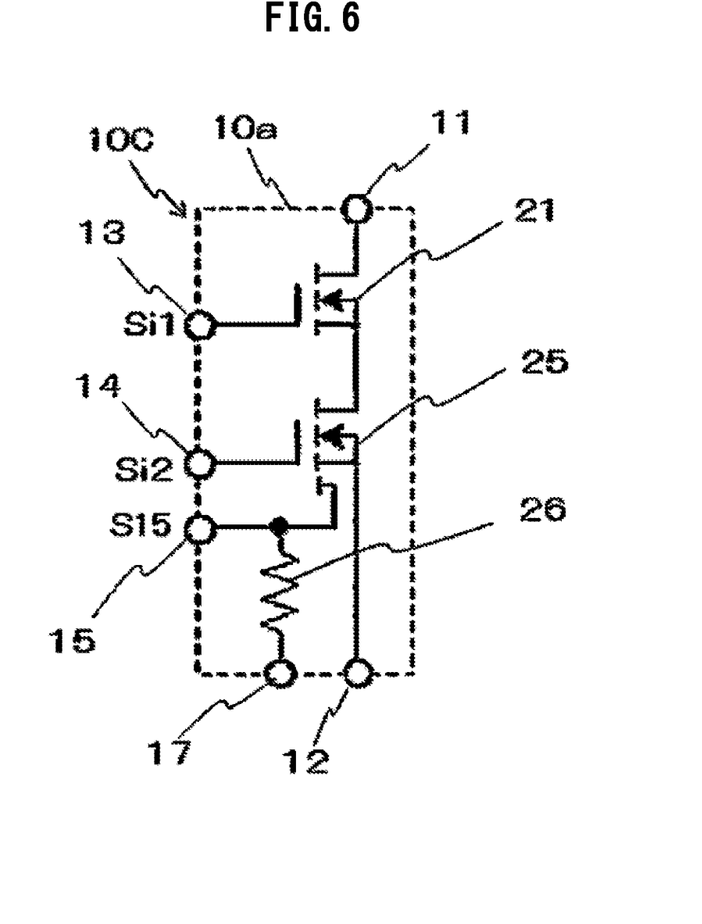
FIG. 6 is a schematic circuit diagram illustrating a power module according to a fourth embodiment of the present invention.

FIG. 6 is a schematic circuit diagram illustrating a power module according to a fourth embodiment of the present invention. Some of the elements that are the same as those in FIG. 1 illustrating the first embodiment will be referred to by using the same reference characters.

In a power module 10C according to the fourth embodiment, a current-interrupting purpose switch MOSFET 25, a resistor 26 serving as a current detecting means, and a current-detecting purpose detection terminal 17 are provided, in place of the MOSFET 22 and the resistor 23 provided in the power module 10 according to the first embodiment. The MOSFET 25 is a device obtained by integrating a main switching-purpose MOSFET together with a current-detecting purpose MOSFET (i.e., a so-called sense MOSFET). The MOSFET 25 has the current-detecting purpose terminal.

The detection terminal 15 is connected to the current-detecting purpose terminal of the MOSFET 25. The resistor 26 is connected to a point between the detection terminal 15 and the detection terminal 17. The MOSFET 25 has a function of going into the ON state so as to conduct the current flowing in the MOSFET 21 during normal operations of the MOSFET 21 and a function of going into the OFF state so as to interrupt the current flowing in the MOSFET 21 when a short-circuit failure has occurred in the MOSFET 21.

The other configurations of the fourth embodiment are the same as those in the first embodiment.

An Operation in the Fourth Embodiment

Because the MOSFET 25 is connected in series to the MOSFET 21, a signal corresponding to the current value of MOSFET 25 detected as a voltage value between the two ends of the resistor 26 also corresponds to the current value of the MOSFET 21.

The power module 10B according to the fourth embodiment is controlled, for example, by a control circuit similar to the externally-connected control circuit 50 illustrated in FIG. 3. When a short-circuit failure has occurred in the MOSFET 21, the current in the MOSFET 21 increases. As a result, the current flowing in the MOSFET 25 also increases, and the detection voltage values detected from the detection terminals 15 and 17 therefore increase. The detection voltage values are supplied, for example, to the control circuit similar to the control circuit 50 illustrated in FIG. 3.

For example, in the control circuit similar to the control circuit 50 illustrated in FIG. 3, the comparison circuit 53 compares the supplied detection voltage value with the reference voltage Vref. The reference voltage Vref is set to have such a voltage value with which it is possible to judge a detection voltage value detected during a normal operation of the MOSFET 21 and a detection voltage value detected at the time of a short-circuit failure.

When the detection voltage value is smaller than the reference voltage Vref, the comparison circuit 53 outputs a comparison signal yielding a normal operation. On the contrary, when the detection voltage value is larger than the reference voltage Vref, the comparison circuit 53 outputs a comparison signal yielding an interrupting operation. While the comparison signal yielding the normal operation is being output from the comparison circuit 53, the latch circuit 54 outputs the control signal Si2 that brings the MOSFET 25 into the ON state. In contrast, once the comparison signal yielding the interrupting operation is output from the comparison circuit 53, the latch circuit 54 outputs the control signal Si2 that brings the MOSFET 25 into the OFF state and maintains this state.

Advantageous Effects of the Fourth Embodiment

The power module 10B according to the fourth embodiment is configured, when a short-circuit failure has occurred in the MOSFET 21, to detect the occurrence of the short-circuit failure on the basis of the voltage value between the two ends of the resistor 26. Accordingly, it is possible to interrupt any excessive current by causing the MOSFET 25 to instantly block the current path of the MOSFET 21. It is therefore possible to prevent the MOSFET 21 from having a radical and rapid temperature increase.

Fifth Embodiment

A Configuration According to a Fifth Embodiment

Figure 7:
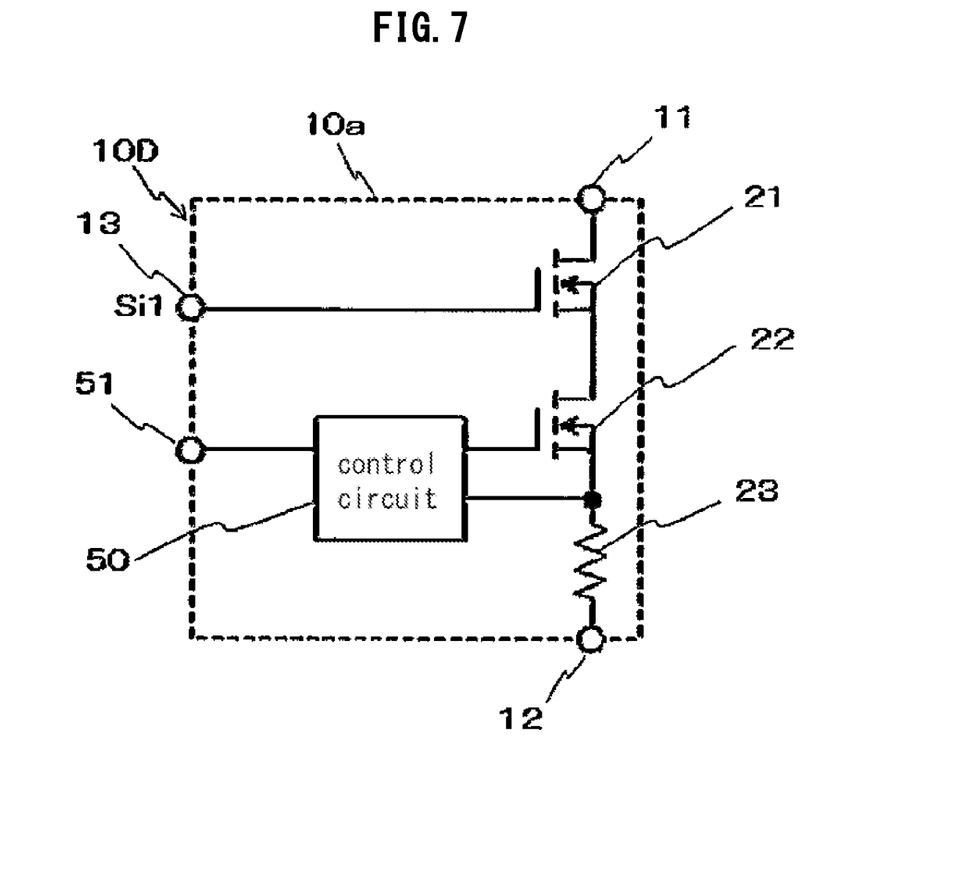
FIG. 7 is a schematic circuit diagram illustrating a power module according to a fifth embodiment of the present invention.

FIG. 7 is a schematic circuit diagram illustrating a power module according to a fifth embodiment of the present invention. Some of the elements that are the same as those in FIG. 3 illustrating the first embodiment will be referred to by using the same reference characters.

In a power module 10D according to the fifth embodiment, the externally-connected control circuit 50 illustrated in FIG. 3 is housed in the package 10a, so as to structure a power module that has the control circuit installed therein. The control circuit 50 installed in the package 10a is configured by using, for example, a semiconductor Integrated Circuit (IC) having one or more chips.

The other configurations of the fifth embodiment are the same as those illustrated in FIG. 3 according to the first embodiment.

An Operation in the Fifth Embodiment

The power module 10D having the control circuit installed therein according to the fifth embodiment performs the same operations as those illustrated in FIG. 3 according to the first embodiment.

Advantageous Effects of the Fifth Embodiment

The power module 10D according to the fifth embodiment achieves the same advantageous effects as those illustrated in FIG. 3 according to the first embodiment. Further, because the power module 10D according to the fifth embodiment has the control circuit 50 installed in the package 10a, when the power module 10D is used in a power source circuit or the like, it is not necessary to have an externally-connected control circuit. It is therefore possible to easily apply the power module 10D to various circuits.

Modification Examples of the First to the Fifth Embodiments

The present invention is not limited to the first to the fifth embodiments described above. Other various modes of use and modifications are also possible. Examples of possible modes of use and modifications include the following listed under (a) to (f):

(a) The power semiconductor devices that can be installed in the power modules 10 and 10A to 10D are not limited to the MOSFETs 21, 22, and 25 and may each be a bipolar transistor, an IGBT, or the like. The number of power semiconductor devices may be two or more. In addition, other elements such as a diode, a resistor, a capacitor, and/or the like may also be installed therein.

(b) A switching device other than the MOSFET 22 or 25 may be used as the current-interrupting purpose switch.

(c) When the resistor 23 or 26 is used as a current detecting element, the insertion position thereof is not limited to the insertion positions described in the first, the second, the fourth, and the fifth embodiments. It is sufficient when the resistor 23 or 26 is inserted so as to be connected in series to the power semiconductor device and it is possible to output the voltage between the two ends thereof.

(d) As for the device used as the current detecting means, any device capable of detecting the current flowing in the power semiconductor device is acceptable. For example, a Hall effect sensor or the like is also usable.

(e) Possible configurations of the control circuit 50 are not limited to the configuration illustrated in FIG. 3. The control circuit 50 may have any configuration as long as it is possible to judge the occurrence of a short-circuit failure on the basis of the current detection signal S15 or the like and to output the control signal Si2 to the switch.

(f) Another configuration is also acceptable in which, when a certain failure has occurred in the MOSFET 21, the MOSFET 22 serving as a current-interrupting purpose switch takes over the role of the MOSFET 21.

REFERENCE SIGNS LIST

10, 10-1, 10-2, 10A, 10B, 10C, and 10D: POWER MODULE
10a: PACKAGE
21, 22, 25: MOSFET
23, 26: RESISTOR
24: TEMPERATURE SENSING DEVICE
50: CONTROL CIRCUIT
53: COMPARISON CIRCUIT
54: LATCH CIRCUIT

The invention claimed is:

1. A power module wherein a package houses therein:
a current input terminal and a current output terminal;
a power semiconductor device used for a switching purpose to conduct/interrupt a current, which flows from the current input terminal to the current output terminal, according to a switching signal;
a resistor for detecting an operation state of the power semiconductor device; and
a switch for a current-interrupting purpose that is connected in series to the power semiconductor device,
wherein the power semiconductor device, the switch and the resistor are in series connected between the current input terminal and the current output terminal,
one end of the power semiconductor device is connected to the current input terminal, and the other end of the power semiconductor device is connected to the switch at a connection point for connecting the power semiconductor device and the switch to each other,
one end of the switch is connected to the connection point and the other point of the switch is connected to one end of the resistor,
the other end of the resistor is connected to the current output terminal, and
the switch is configured to, in response to a control signal generated on a basis of a voltage between the one end of the switch and the other end of the resistor, go into a conduction state so as to conduct a current flowing in the power semiconductor device during a normal operation of the power semiconductor device and to go into an interruption state so as to interrupt the current flowing in the power semiconductor device when a short-circuit failure has occurred in the power semiconductor device.

2. The power module according to claim 1, comprising a control circuit provided either inside or outside of the package, wherein when the voltage between the one end of the switch and the other end of the resistor exceeds a predetermined value, the control circuit determines that the short-circuit failure has occurred in the power semiconductor device and generates the control signal.

\* \* \* \* \*